United States Patent [19]

Drage et al.

[11] Patent Number: 4,790,258

[45] Date of Patent: Dec. 13, 1988

[54] MAGNETICALLY COUPLED WAFER LIFT PINS

[75] Inventors: David J. Drage, Sebastopol; Roger B. Lachenbruch, Sausalito; Herbert G. Drake, Jr., San Rafael; Jerris H. Peavey, Novato, all of Calif.

[73] Assignee: Tegal Corporation, Petaluma, Calif.

[21] Appl. No.: 34,121

[22] Filed: Apr. 3, 1987

[51] Int. Cl.[4] ............................................. B05C 13/00
[52] U.S. Cl. ..................................... 118/500; 118/729; 198/619; 198/346.2; 414/217
[58] Field of Search ............... 118/500, 729; 414/217, 414/660; 198/619, 346.2, 468.8; 285/918

[56] References Cited

U.S. PATENT DOCUMENTS

| | | | |
|---|---|---|---|
| 2,703,719 | 3/1955 | Crothers | 285/918 X |
| 4,523,985 | 6/1985 | Dimock | 414/217 X |
| 4,540,326 | 9/1985 | Southworth et al. | 198/619 X |
| 4,558,984 | 12/1985 | Garrett | 414/217 X |
| 4,584,045 | 4/1986 | Richards | 414/222 X |
| 4,589,541 | 5/1986 | Lisec | 198/619 X |
| 4,591,044 | 5/1986 | Orami et al. | 198/468.8 X |
| 4,632,624 | 12/1986 | Mirkovich et al. | 118/500 X |
| 4,664,578 | 5/1987 | Kakehi | 414/217 |

FOREIGN PATENT DOCUMENTS 0219724 11/1985 Japan ..................... 118/730

Primary Examiner—Shrive Beck
Assistant Examiner—Alain Bashore
Attorney, Agent, or Firm—Paul F. Wille

[57] ABSTRACT

An improved pin lift mechanism for plasma processing of semiconductor wafers is disclosed in which the pins are each contained in a non-magnetic tube which is sealed to the wafer chuck. A magnetic slug in each tube couples external motion of a magnet to the pin.

5 Claims, 1 Drawing Sheet

MAGNETICALLY COUPLED WAFER LIFT PINS

BACKGROUND OF THE INVENTION

This invention relates to equipment for plasma processing semiconductor wafers and, in particular, to a pin lift mechanism which can be incorporated into an electrode of said equipment.

In the prior art, such as disclosed in U.S. Pat. No. 4,632,624, three or more pins are used to raise a semiconductor wafer above an electrode in a plasma reactor. The pins extend through the electrode and are attached to a lift plate located beneath the electrode. The lift plate is enclosed in a small chamber. This chamber presents a problem in that it increases the volume which must be pumped and purged. It increases process times because it increases the volume of the system. The chamber further presents a problem in purging the system of unwanted gases since it presents a volume in which they can be trapped. In addition to possibly contaminating the gases in the reactor chamber proper, there is the difficulty of having reactive gases entering the chamber and possibly corroding materials therein.

In purely mechanical terms, a wafer pin lift represents a somewhat delicate mechanism and a source of particles due to the closeness of fit of the pins within their respective bores. The motion of the lift mechanism must be quite accurate to avoid misaligning the pins in the bores. Further, the pins are rigidly held in place while receiving a wafer; i.e. there is no give in the system to soften the contact between the wafer and the pins.

In view of the foregoing, it is therefore an object of the present invention to provide an improved pin lift mechanism for semiconductor wafers.

Another object of the present invention is to reduce the time necessary for pumping down and/or purging a plasma processing system having a lift pin assembly.

A further object of the present invention is to provide a pin lift mechanism having a compliant member.

SUMMARY OF THE INVENTION

The foregoing objects are achieved in the present invention wherein each lift pin is contained in a non-magnetic sleeve which is closed at one end and sealed to an electrode at the other end. Between the pin and the sealed end is a magnetic slug. The closed end extends below the electrode so that a magnetic actuator can be magnetically coupled to the slug. As the slug moves upwardly, it lifts the pin which, in turn, lifts the wafer. As the slug is lowered, it permits the pin to move downwardly due to gravity.

BRIEF DESCRIPTION OF THE DRAWINGS

A more complete understanding of the present invention can be obtained by considering the following detailed description in conjunction with the accompanying drawings, in which.

DETAILED DESCRIPTION OF THE INVENTION

Figure 1:
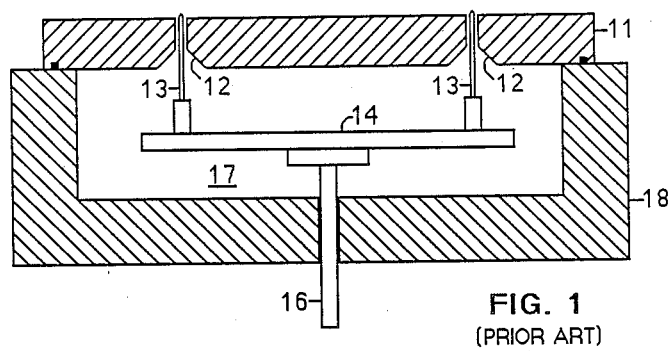
FIG. 1 illustrates a lift pin mechanism in accordance with the prior art.

In a pin lift mechanism in accordance with the prior art, as illustrated in FIG. 1, lower electrode 11 of a plasma reactor (not shown) comprises a plurality of bores 12 through which pins 13 extend. Pins 13 are supported by plate 14, to which they are attached. Plate 14 is moved in an up and down direction by way of a suitable drive mechanism (not shown) coupled to plate 14 by way of rod 16. Enclosing plate 14 and the lower portions of pins 13, as well as a portion of rod 16, is wall 18 which defines an enclosed volume 17. Enclosed volume 17 communicates through bores 12 with the reactor chamber. Thus, when the system is evacuated or purged, chamber 17 must be evacuated or purged as well. In addition, depending upon the process being run, corrosive gases may enter chamber 17 by way of bores 12, causing undesirable side effects on the components used for pins 13, plate 14, or rod 16.

Figure 2:
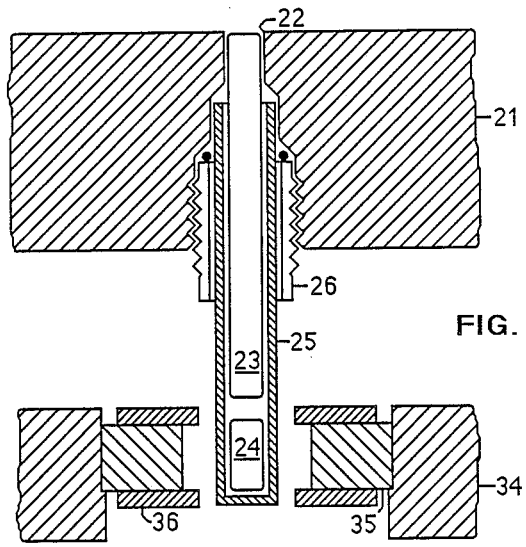
FIG. 2 illustrates a preferred embodiment of the present invention.

As illustrated in FIG. 2, these difficulties are overcome, in accordance with the present invention, wherein lower electrode 21 comprises a plurality of bores 22 in which nonmetallic sleeve 25 is inserted and sealed thereto, for example, by an O-ring and an O-ring compression screw 26. Into bore 22 and the chamber formed by non-conductive sleeve 25, is inserted pin 23 and magnetic slug 24. As thus configured, sleeve 25 and bore 22 add very little volume to the volume of the plasma reactor.

Located adjacent slug 24 is ring magnet 35 and pole pieces 36. Ring magnet 35 is attached to lift plate 34 which is moved up and down by any suitable drive mechanism (not shown). As lift plate 34 is moved upwardly, slug 24 moves upwardly within sleeve 25 and raises pin 23. Similarly, when lift plate 34 is lowered, slug 24 is lowered and pin 23 is lowered, either by gravity or by a mechanical connection to slug 24. Lift plate 34, magnetic 35, and pole pieces 36 can operate in any atmosphere or pressure because tube 25 is sealed at both ends.

Electrode 21 typically comprises aluminum. Pin 23 preferably comprises quartz while slug 24 preferably comprises Teflon coated soft iron. Tube 25 preferably comprises non-magnetic stainless steel while compression screw 26 comprises brass.

As thus constructed, very little additional volume is added to the reactor chamber by virtue of the lift pin mechanism. In addition, one obtains the benefit of a compliant mount in that pin 23 is magnetically supported by slug 24. This simplifies the handling of a wafer and reduces the chance for damage by virtue of coming into contact with the tip of pin 23, even though the tip of pin 23 may be blunted. In addition, the pin lift mechanism in accordance with the present invention is readily maintained by virtue of the ease with which the pins can be removed for maintenance, e.g. for cleanings or due to breakage. In addition, for some processes, it is desirable to use electrically conductive pins, in which case the pins are readily exchanged by simply raising the pins and removing them. Since the pins are not permanently attached, the change is readily accomplished.

There is thus provided by the present invention and improved pin lift mechanism in which process times are reduced by virtue of the decrease in volume which must be pumped or purged. The wafers are more gently handled and the system is generally easier to maintain. Further, one obtains an increase in flexibility due to the ease with which the type of pin can be changed.

Having thus described the invention it will be apparent to those of ordinary skill in the art that various modifications can made within the spirit and scope of the present invention. For example, the choice of pole piece is not critical and any suitable magnetic pole piece may be used. Similarly, slug 24 need not be attached to pin 23, except in those situations where pin 23 is operating in an orientation other than that illustrated in FIG. 2. That is, the pin lift mechanism of the present invention can be used in any orientation provided that some means is added to prevent pin 23 from slipping out in the event the mechanism is inverted from the orientation illustrated in FIG. 2. The simplest way to accomplish this is by mechanically coupling pin 23 and slug 24. While described in conjunction with a lower electrode in a plasma reactor, the pin lift mechanism of the present invention can be used elsewhere in any wafer or disc handling system.

We claim:

1. In a plasma reactor having a platelike member for receiving an article to be treated, a pin lift mechanism connected with said plate comprising:

a non-magnetic sleeve having a first end which is closed and a second end located within a bore in said member;

a magnetic slug located in said sleeve near said closed end;

a pin located in said sleeve;

wherein said slug and said pin are freely moveable within said sleeve; and means, outside said sleeve and magnetically coupled to said slug, for moving said slug and said pin within said sleeve.

2. The apparatus as set forth in claim 1 wherein said pin comprises quartz.

3. The apparatus as set forth in claim 2 wherein said pin comprises a conductor.

4. The apparatus as set forth in claim 1 and further comprising means for sealing said sleeve within said bore.

5. The apparatus as set forth in claim 4 wherein said sealing means comprises an O-ring and an O-ring compression screw threaded into said member.

* * * * *